US011205675B2

(12) United States Patent
Jia

(10) Patent No.: US 11,205,675 B2
(45) Date of Patent: Dec. 21, 2021

(54) ELECTRONIC DEVICE HAVING THIN FILM CAMERA

(71) Applicant: Guangdong Oppo Mobile Telecommunications Corp., Ltd., Guangdong (CN)

(72) Inventor: Yuhu Jia, Guangdong (CN)

(73) Assignee: SHENZHEN HEYTAP TECHNOLOGY CORP., LTD., Guangdong (CN)

( * ) Notice: Subject to any disclaimer, the term of this patent is extended or adjusted under 35 U.S.C. 154(b) by 172 days.

(21) Appl. No.: 16/530,550

(22) Filed: Aug. 2, 2019

(65) Prior Publication Data
US 2020/0052032 A1    Feb. 13, 2020

(30) Foreign Application Priority Data

Aug. 7, 2018  (CN) .......................... 201810889130.3

(51) Int. Cl.
| H01L 27/146 | (2006.01) |
| G02F 1/01 | (2006.01) |
| H04M 1/02 | (2006.01) |
| H04N 5/225 | (2006.01) |
| H04N 5/232 | (2006.01) |

(52) U.S. Cl.
CPC ...... *H01L 27/14692* (2013.01); *G02F 1/0105* (2013.01); *H01L 27/14607* (2013.01); *H01L 27/14634* (2013.01); *H04M 1/0264* (2013.01); *H04M 1/0266* (2013.01); *H04N 5/2252* (2013.01); *H04N 5/23229* (2013.01)

(58) Field of Classification Search
CPC ......... H01L 27/14692; H01L 27/14607; H01L 27/14634; G02F 1/0105; H04M 1/0264; H04M 1/0266; H04M 1/026; H04N 5/2252; H04N 5/23229; H04N 5/2253
See application file for complete search history.

(56) References Cited

U.S. PATENT DOCUMENTS

| 5,892,227 A * | 4/1999 | Schieber ................. G01T 1/241 |
| | | 250/370.12 |
| 9,992,389 B1 * | 6/2018 | Fu .......................... H04N 5/2251 |
| 10,684,509 B2 * | 6/2020 | Jin ......................... G02B 6/0053 |
| 2014/0244890 A1 * | 8/2014 | Park .................... G06F 13/4068 |
| | | 710/317 |

(Continued)

FOREIGN PATENT DOCUMENTS

| CN | 201041588 Y | 3/2008 |
| CN | 102760040 A | 10/2012 |

(Continued)

OTHER PUBLICATIONS

English translation of Rejection decision for CN application 201810889130.3 dated Jun. 29, 2020.
Office Action for EP Application 19189941.8 dated Oct. 2, 2020.
English translation of OA for CN application 201810889130.3 dated Mar. 2, 2020.

(Continued)

*Primary Examiner* — Seung C Sohn
(74) *Attorney, Agent, or Firm* — Young Basile Hanlon & MacFarlane, P.C.

(57) ABSTRACT

The present disclosure provides an electronic device, including a thin film camera. The thin film camera includes an image processor arranged in the electronic device, and a film structure disposed to an outer surface of the electronic device. The film structure is configured for processing incident lights by a photosensitive array to capture an image, and the image processor is in communication with the film structure.

17 Claims, 3 Drawing Sheets

(56) References Cited

U.S. PATENT DOCUMENTS

2015/0124195 A1    5/2015  Chen et al.
2016/0091737 A1    3/2016  Kim et al.
2018/0131859 A1    5/2018  Bayat et al.

FOREIGN PATENT DOCUMENTS

| CN | 103744254 A | 4/2014 |
|---|---|---|
| CN | 205510137 U | 8/2016 |
| CN | 108108049 A | 6/2018 |
| CN | 108227311 A | 6/2018 |
| CN | 108683767 A | 10/2018 |
| EP | 3249494 A1 | 11/2017 |

OTHER PUBLICATIONS

Office Action for EP application 19189941.8.
ISR for PCT application PCTCN 2019095467.
Office Action with English translation for CN application 201810889130.3.
Proceedings of the IEEE; vol. 105, No. 5, May 2017; Oliver Bimber and Alexander Koppelhuber; Toward a Flexible, Scalable, and Transparent Thin-Film Camera; pp. 960-969.
Microcontrollers and Embedded Systems; Dec. 2015; The Advent of The Camera Revolution—Quantum Thin Film Sensors Challenge Conventional CMOS; p. 84.
Research Article, Optics Express, vol. 25, No. 16; Aug. 7, 2017; Optics Express 18526; Thin-film Camera Using Luminescent Concentrators and an Optical Seller Collimator; 11 pages.
Indian Examination Report for IN Application 201914028138 dated Jun. 18, 2021. (6 pages).

* cited by examiner

ELECTRONIC DEVICE HAVING THIN FILM CAMERA

CROSS-REFERENCE TO RELATED APPLICATION(S)

This application claims priority to and benefit of Chinese Patent Application Serial No. 201810889130.3, filed on Aug. 7, 2018. The entire content of the before-mentioned patent application is incorporated herein by reference.

TECHNICAL FIELD

The present disclosure relates to a field of communication devices, and more particularly to an electronic device.

BACKGROUND

In the realization of a full screen, the placement of a front camera has always been a pain of the full-screen industrial design so far and results in an occurrence of a notch screen and a special-shaped screen. For the placement of the front camera, solutions like liftable and lowerable cameras are also proposed, but such solutions require additional stepper motors or similar mechanisms, which greatly increases the complexity of industrial design and circuit design, and hence significantly increases the cost. For a rear camera, most products will have a certain protrusion due to a height of a CMOS camera module, which affects an overall appearance of a mobile phone.

SUMMARY

An electronic device according to a first aspect of embodiments of the present disclosure includes a thin film camera. The thin film camera includes an image processor arranged in the electronic device and a film structure disposed to an outer surface of the electronic device. The film structure is configured for processing incident lights by a photosensitive array to capture an image. The image processor is in communication with the film structure.

An electronic device according to a second aspect of embodiments of the present disclosure includes a housing assembly, an image processor arranged in the housing assembly, and a film structure disposed to an outer surface of the housing assembly. The film structure is configured to capture an image. The image processor is communicated with the film structure and configured to process the image captured by the film structure.

An electronic device according to a third aspect of embodiments of the present disclosure includes a display assembly embedded in the electronic device, an image processor arranged in the electronic device and shielded by the display assembly, and a film structure disposed to an outer surface of the display assembly. The film structure is configured to capture an image. The image processor is communicated with the film structure and configured to process the image captured by the film structure.

BRIEF DESCRIPTION OF DRAWINGS

The foregoing and/or additional aspects and advantages of the present disclosure will become obvious and easily understood in descriptions of embodiments with reference to the following accompanying drawings.

DETAILED DESCRIPTION

Figure 1:
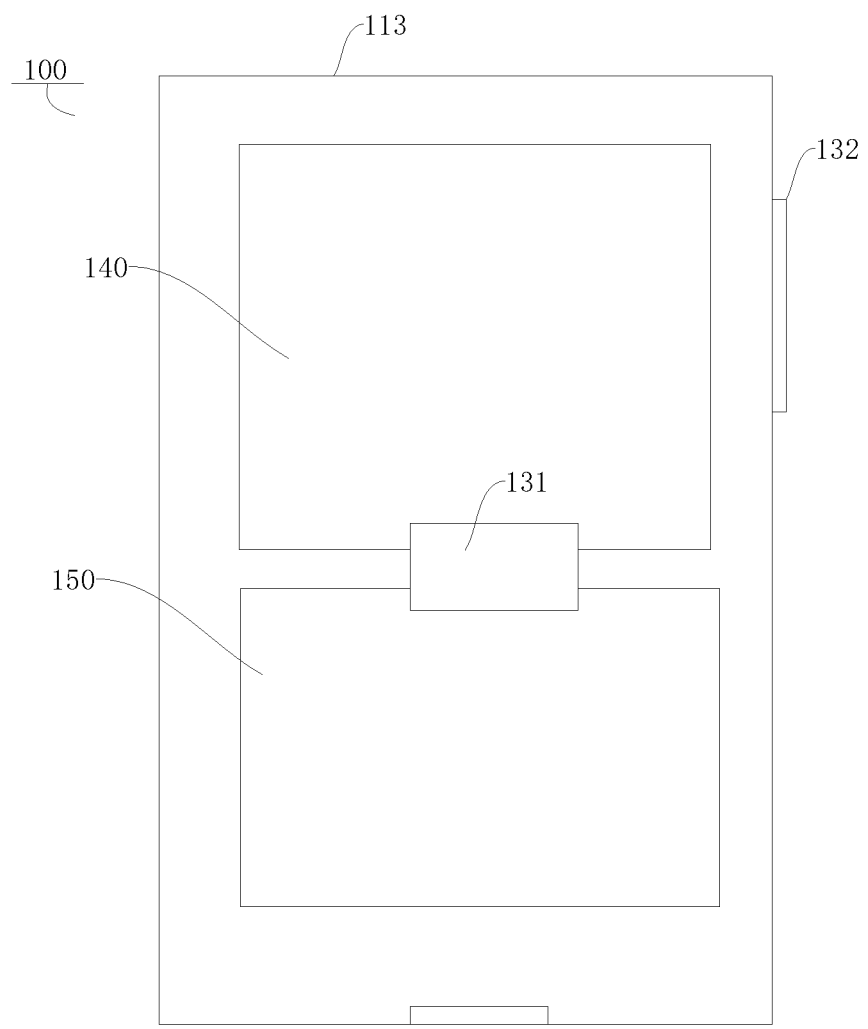
FIG. 1 is a partial schematic view of an electronic device according to an embodiment of the present disclosure, in which a battery cover is removed.

Embodiments of the present disclosure will be further described with reference to the drawings. The same or similar elements and the elements having the same or similar functions are denoted by like reference numerals throughout the descriptions. Embodiments described herein with reference to the drawings are explanatory, serve to explain the present disclosure, and are not construed to limit embodiments of the present disclosure.

An electronic device 100 according to an embodiment of the present disclosure will be described below with reference to FIGS. 1 to 4.

Figure 2:
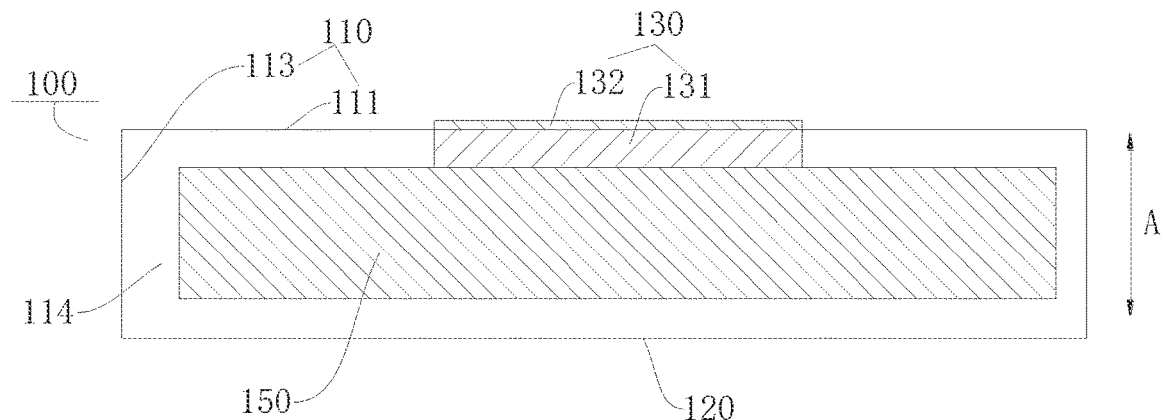
FIG. 2 is a cross-sectional view of an electronic device according to an embodiment of the present disclosure, in which a connection between a battery and a thin film camera is illustrated.

As illustrated in FIGS. 1 and 2, the electronic device 100 according to an embodiment of the present disclosure includes a housing assembly 110, a display assembly 120, and a thin film camera 130. It should be noted that "thin" in "thin film" is not a degree determiner of thickness, and can be understood to indicate a film structure 132. That is, the "thin film camera 130" can be understood as a camera assembly configured by replacing a lens assembly with the film structure 132. In addition, the electronic device 100 may be a mobile phone, a tablet, or a notebook computer.

In some embodiments, the display assembly 120 is used to present images and text information, and the display assembly 120 is embedded in the housing assembly 110. The thin film camera 130 includes an image processor 131 and a film structure 132 configured to capture an image. The film structure 132 includes a photosensitive array 133 and captures the image via processing incident lights by the photosensitive array 133. The film structure 132 is disposed on an outer surface of the electronic device 100, and the image processor 131 is in communication with the film structure 132 and is arranged in the housing assembly 110. It should be noted that the thin film camera 130 captures the image by processing the incident lights with the photosensitive array 133, and each element in the array is configured to receive light waves. Due to superposition of the light waves, the light waves in one of incident directions will be enhanced, and the light waves in other directions will be offset. The photosensitive array 133 may be formed by quantum films of special materials, and an image acquisition is realized by the image processor 131 and the light capturing.

As compared with the related art, the image is achieved by replacing the lens (or the lens assembly) with the film structure 132. The film structure 132 may be directly attached to the outer surface of the electronic device 100, and the image processor 131 may be disposed inside the housing assembly 110, which can reduce or eliminate a local protrusion of the electronic device 100 due to an excessive thickness of the camera assembly, such that the thickness of the thin film camera 130 can be reduced, thus making it convenient to arrange the thin film camera 130 to the housing assembly 110.

Figure 3:
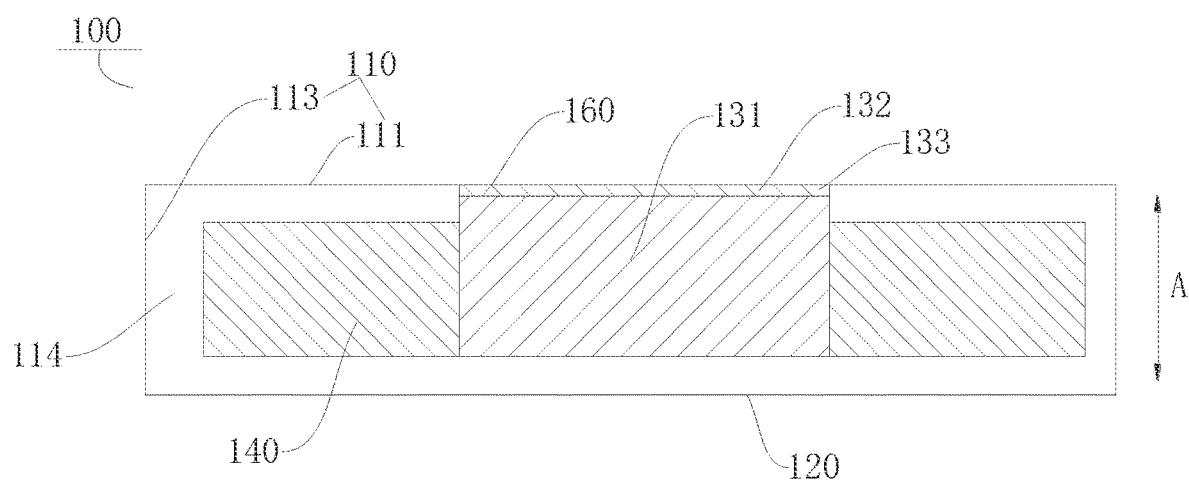
FIG. 3 is a cross-sectional view of an electronic device according to an embodiment of the present disclosure, in which a connection between a mainboard and a thin film camera is illustrated.

As illustrated in FIGS. 2 and 3, according to some embodiments of the present disclosure, the housing assembly 110 includes a battery cover 111 and a middle frame 113. The middle frame 113 is connected to the battery cover 111 to define a receiving cavity 114, the image processor 131 is arranged in the receiving cavity 114, and the display assembly 120 is embedded in the middle frame 113, such that the display assembly 120 can be easily mounted to the housing assembly 110. It should be noted that the battery cover 111 may be configured as a rear case of the housing assembly 110, and the middle frame 113 may be configured as a side wall of the housing assembly 110. The middle frame 113 may have an annular structure and be connected to a periphery of the battery cover 111, and the display assembly 120 is arranged on a side of the annular middle frame 113 in an axial direction A.

Figure 4:
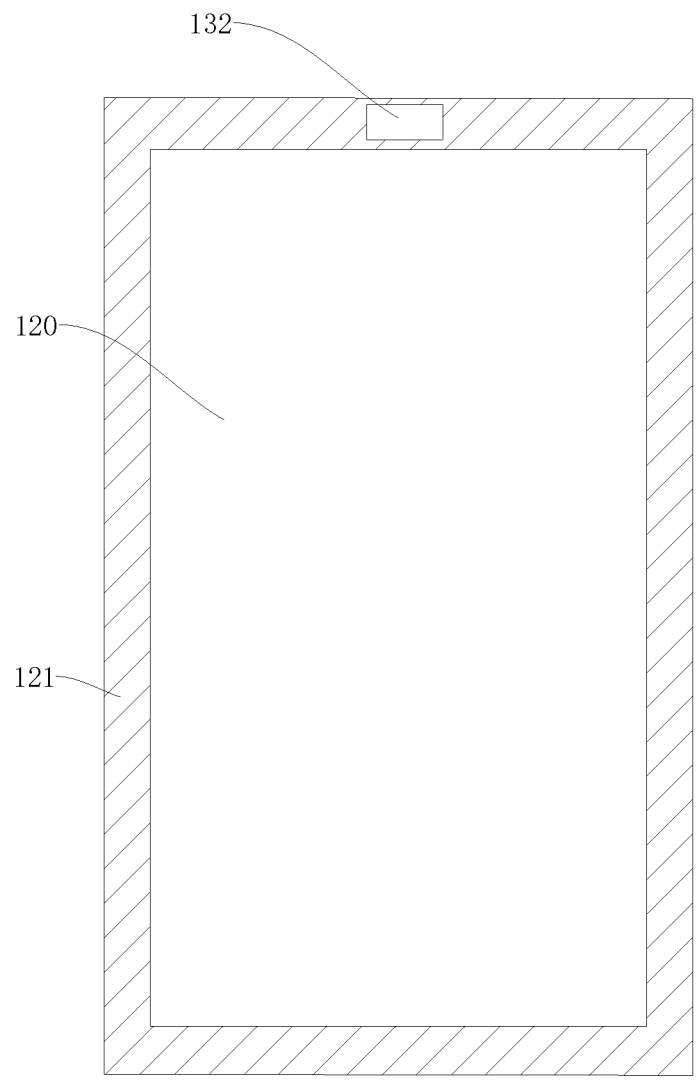
FIG. 4 is a top view of an electronic device according to an embodiment of the present disclosure.

In some embodiments, as illustrated in FIG. 1, the film structure 132 may be arranged to the middle frame 113. Certainly, a position of the film structure 132 is not limited to this. In some embodiments, the film structure 132 is arranged on an outer surface of the battery cover 111. To facilitate the arrangement of the film structure 132, in some embodiments as illustrated in FIG. 3, the outer surface of the battery cover 111 has a groove 160, and the film structure 132 is arranged in this groove 160. It should be noted that the groove 160 may be configured to have a LOGO shape or a letter shape. In some embodiments, the film structure 132 is arranged to the display assembly 120, thereby increasing flexibility of the arrangement of the film structure 132. Further, as illustrated in FIG. 4, the film structure 132 is disposed at an edge 121 of the display assembly 120. On one hand, the edge 121 of the display assembly 120 can be effectively utilized, and on the other hand, the film structure 132 can be prevented from affecting a display effect of the display assembly 120.

According to some embodiments of the present disclosure, the image processor 131 is connected to the battery cover 111, so as to optimize positions of various components in the housing assembly 110. Certainly, the position of the image processor 131 is not limited to this. In some embodiments, as illustrated in FIG. 3, at least a part of the image processor 131 is disposed to a mainboard 140 of the electronic device 100. Further, the at least part of the image processor 131 is inserted in the mainboard 140 of the electronic device 100, and the thin film camera 130 has an outer surface flush with the outer surface of the electronic device 100. Moreover, the outer surface of the electronic device 100 has a groove 160, and the film structure 132 is arranged in the groove 160 and has an outer surface flush with the outer surface of the electronic device 100.

In some embodiments, as illustrated in FIG. 2, at least a part of the image processor 131 is overlapped with the battery 150 of the electronic device 100. Further, the at least part of the image processor 131 is arranged on the battery 150 of the electronic device 100, and a surface of the at least part of the image processor 131 away from the battery 150 is flush with the outer surface of the electronic device 100. Consequently, the arrangement of the image processor 131 may be optimized.

In the present disclosure, it should be understand that terms such as "thickness", "up", "down", "inside", "outside" refer to directions and location relations which are the directions and location relations shown in the drawings, intended for describing the present disclosure conveniently and simplifying the description, but are not intended to indicate or imply that the devices or the elements are arranged in particular orientations or are configured and operated in the particular orientations, which thus should not be construed to limit the present disclosure.

Reference throughout this specification to "an embodiment", "some embodiments", "an exemplary embodiment", "an example", "a specific example", or "some examples" means that a particular feature, structure, material, or characteristic described in connection with the embodiment or example is included in at least one embodiment or example of the present disclosure. In this specification, exemplary descriptions of aforesaid terms are not necessarily referring to the same embodiment or example. Furthermore, the particular features, structures, materials, or characteristics may be combined in any suitable manner in one or more embodiments or examples.

Although embodiments of present disclosure have been shown and described above, it should be understood by those skilled in the art that changes, alternatives, and modifications can be made to the embodiments without departing from spirit and principles of the present disclosure. The scope of the present disclosure is limited by the attached claims and its equivalents.

What is claimed is:

1. An electronic device, comprising a thin film camera, wherein the thin film camera comprises:
    an image processor arranged in the electronic device; and
    a film structure disposed to an outer surface of the electronic device, the film structure comprising a photosensitive array and being configured for processing incident lights by the photosensitive array to capture an image, the image processor being in communication with the film structure,
    wherein at least a part of the image processor is inserted in a mainboard of the electronic device, the thin film camera has an outer surface that is flush with the outer surface of the electronic device, the outer surface of the electronic device has a groove, and the film structure is arranged in the groove and has an outer surface that is flush with the outer surface of the electronic device.

2. The electronic device according to claim 1, further comprising a housing assembly and a display assembly embedded in the housing assembly, wherein the housing assembly comprises:
    a battery cover; and
    a middle frame connected to the battery cover to define a receiving cavity, the image processor being arranged in the receiving cavity, the display assembly being embedded in the middle frame.

3. The electronic device according to claim 2, wherein the film structure is arranged to an outer surface of the battery cover.

4. The electronic device according to claim 3, wherein the outer surface of the battery cover has the groove, and the film structure is arranged in the groove.

5. The electronic device according to claim 2, wherein the film structure is arranged to the middle frame.

6. The electronic device according to claim 2, wherein the film structure is arranged to the display assembly.

7. The electronic device according to claim 6, wherein the film structure is arranged to an edge of the display assembly.

8. The electronic device according to claim 2, wherein the image processor is connected to the battery cover.

9. The electronic device according to claim 1, wherein at least a part of the image processor is overlapped with a battery of the electronic device.

10. The electronic device according to claim 9, wherein the at least part of the image processor is arranged on the battery of the electronic device, and a surface of the at least part of the image processor away from the battery is flush with the outer surface of the electronic device.

11. An electronic device, comprising:
   a housing assembly;
   an image processor arranged in the housing assembly; and
   a film structure disposed to an outer surface of the housing assembly, and configured to capture an image, the image processor being communicated with the film structure and configured to process the image captured by the film structure,
   wherein at least a part of the image processor is inserted in a mainboard of the electronic device, the outer surface of the housing assembly has a groove, and the film structure is arranged in the groove and has an outer surface that is flush with the outer surface of the housing assembly.

12. The electronic device according to claim 11, wherein the housing assembly comprises:
   a battery cover; and
   a middle frame having an annular shape and connected to a periphery of the battery cover to define a receiving cavity, the image processor being arranged in the receiving cavity.

13. The electronic device according to claim 12, wherein the film structure is arranged to an outer surface of the battery cover.

14. The electronic device according to claim 13, wherein the outer surface of the battery cover has a groove, and the film structure is arranged in the groove.

15. The electronic device according to claim 12, wherein the film structure is arranged to the middle frame.

16. An electronic device, comprising:
   a display assembly embedded in the electronic device;
   an image processor arranged in the electronic device and shielded by the display assembly; and
   a film structure disposed to an outer surface of the display assembly, and configured to capture an image, the image processor being communicated with the film structure and configured to process the image captured by the film structure,
   wherein at least a part of the image processor is inserted in a mainboard of the electronic device, the outer surface of the display assembly has a groove, and the film structure is arranged in the groove and has an outer surface that is flush with the outer surface of the display assembly.

17. The electronic device according to claim 16, wherein the film structure is arranged to an edge of the display assembly.

* * * * *